(12) United States Patent
Baker

(10) Patent No.: US 12,435,965 B2
(45) Date of Patent: Oct. 7, 2025

(54) WAFER STATE DETECTION

(71) Applicant: Lam Research Corporation, Fremont, CA (US)

(72) Inventor: Noah Elliot Baker, West Linn, OR (US)

(73) Assignee: Lam Research Corporation, Fremont, CA (US)

( * ) Notice: Subject to any disclaimer, the term of this patent is extended or adjusted under 35 U.S.C. 154(b) by 91 days.

(21) Appl. No.: 18/558,327

(22) PCT Filed: Apr. 29, 2022

(86) PCT No.: PCT/US2022/026903
§ 371 (c)(1),
(2) Date: Oct. 31, 2023

(87) PCT Pub. No.: WO2022/235499
PCT Pub. Date: Nov. 10, 2022

(65) Prior Publication Data
US 2024/0219165 A1 Jul. 4, 2024

Related U.S. Application Data

(60) Provisional application No. 63/201,522, filed on May 3, 2021.

(51) Int. Cl.
*G01B 7/28* (2006.01)
*H01J 37/32* (2006.01)
(Continued)

(52) U.S. Cl.
CPC ........ *G01B 7/28* (2013.01); *H01J 37/32715* (2013.01); *H01L 21/67288* (2013.01);
(Continued)

(58) Field of Classification Search
CPC ........ G01B 21/08; G01B 21/20; G01B 21/30; G01B 7/08; G01B 7/082; G01B 7/085;
(Continued)

(56) References Cited

U.S. PATENT DOCUMENTS 5,812,361 A * 9/1998 Jones .................. H01L 21/6833
279/128
8,225,683 B2 * 7/2012 Bailey, III ............. G01B 21/20
73/104
(Continued)

FOREIGN PATENT DOCUMENTS

KR     20100063786 A     6/2010
TW       200942769 A    10/2009
WO   WO-2020068139 A1    4/2020

OTHER PUBLICATIONS

International Preliminary Report on Patentability and Written Opinion dated Nov. 16, 2023 in PCT Application No. PCT/US2022/026903.
(Continued)

*Primary Examiner* — David M Schindler
(74) *Attorney, Agent, or Firm* — Weaver Austin Villeneuve & Sampson LLP

(57) ABSTRACT

Various embodiments herein relate to apparatuses and methods for wafer state detection. In some embodiments, an apparatus for wafer state detection is provided, the apparatus comprising: an RF blocking filter; a DC blocking filter; and a controller coupled to a plurality of electrodes associated with an electrostatic chuck (ESC) via the RF blocking filter and the DC blocking filter, wherein the controller is configured to: cause an input signal to be injected in an input side of a circuit associated with the plurality of electrodes, the RF blocking filter, and the DC blocking filter, wherein the input side corresponds to a first electrode; measure characteristics of an output signal at an output side of the circuit, wherein
(Continued)

the output side corresponds to a second electrode; and calculate wafer state characteristics of a wafer positioned on a surface of a platen based on the characteristics of the output signal.

27 Claims, 10 Drawing Sheets

(51) Int. Cl.
*H01L 21/67* (2006.01)
*H01L 21/683* (2006.01)

(52) U.S. Cl.
CPC .. *H01L 21/6833* (2013.01); *H01J 2237/2007* (2013.01); *H01J 2237/24578* (2013.01)

(58) Field of Classification Search
CPC . G01B 7/087; G01B 7/28; G01B 7/14; G01B 7/16; H01L 22/10; H01L 22/12; H01L 22/20; H01L 21/67288; H01L 21/683; H01L 21/6833; H01L 21/6831; H01J 37/32935; H01J 37/3299; H01J 37/32715; H01J 2237/2007; H01J 2237/24578; G01N 21/9501; G01N 21/9503; G01N 21/9505

See application file for complete search history.

(56) References Cited

U.S. PATENT DOCUMENTS

| | | | |
|---|---|---|---|
| 2017/0162417 | A1 | 6/2017 | Ye et al. |
| 2018/0025930 | A1* | 1/2018 | Augustyniak ..... H01L 21/68771 438/798 |
| 2018/0076385 | A1 | 3/2018 | Fuji et al. |
| 2020/0176296 | A1 | 6/2020 | Khaja et al. |

OTHER PUBLICATIONS

International Search Report and Written Opinion dated Aug. 18, 2022, in Application No. PCT/US2022/026903.

TW Office Action and Search Report dated Jun. 27, 2025 in TW Application No. 111116403, with English Translation.

* cited by examiner

WAFER STATE DETECTION

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in their entireties and for all purposes.

BACKGROUND

Electrostatic chucks are frequently used during semiconductor fabrication to grip or clamp a wafer undergoing fabrication. A wafer undergoing fabrication may deform or bow during the fabrication process. Wafer bow may produce undesirable fabrication results. Wafer bow should therefore be mitigated. It may be particularly difficult to detect wafer bow at high temperatures or in applications that utilize plasma.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor implicitly admitted as prior art against the present disclosure.

SUMMARY

Disclosed herein are apparatuses and methods for wafer state detection.

In accordance with some embodiments, an apparatus for wafer state detection is provided, the apparatus comprising: an RF blocking filter: a DC blocking filter; and a controller coupled to a plurality of electrodes associated with an electrostatic chuck (ESC) via the RF blocking filter and the DC blocking filter, wherein the controller is configured to: cause an input signal to be injected in an input side of a circuit associated with the plurality of electrodes, the RF blocking filter, and the DC blocking filter, wherein the input side corresponds to a first electrode of the plurality of electrodes; measure characteristics of an output signal at an output side of the circuit, wherein the output side corresponds to a second electrode of the plurality of electrodes; and calculate wafer state characteristics of a wafer positioned on a surface of a platen of the ESC based on the characteristics of the output signal.

In some embodiments, the RF blocking filter, the DC blocking filter, and the controller are included in a single housing. In some embodiments, the single housing is associated with a power supply of the ESC.

In some embodiments, the RF blocking filter comprises one or more inductors. In some embodiments, the one or more inductors are ferrite core inductors.

In some embodiments, the DC blocking filter comprises a capacitor. In some embodiments, the capacitor is of a same order of magnitude of a plurality of capacitors that each couple RF inputs to the plurality of electrodes.

In some embodiments, the input signal has a carrier frequency corresponding to a resonant frequency of the circuit associated with the plurality of electrodes, the RF blocking filter, and the DC blocking filter, wherein the resonant frequency is determined during a calibration process of the circuit. In some embodiments, the calibration process comprises determining the resonant frequency of the circuit with no wafer positioned on the surface of the platen or with a flat wafer positioned on the surface of the platen. In some embodiments, the characteristics of the output signal comprise a phase of the output signal. In some embodiments, calculating the wafer state characteristics comprises estimating an amount of wafer bow based on a difference of the phase of the output signal relative to the input signal. In some embodiments, the controller is further configured to estimate the amount of wafer bow based on the difference of the phase of the output signal relative to the input signal using one or more best fit coefficients.

In some embodiments, the controller is further configured to: identify a resonant frequency of a circuit associated with the plurality of electrodes, the RF blocking filter, the DC blocking filter, and the wafer positioned on the surface of the platen; estimate a capacitance of the wafer to the surface of the platen based on the resonant frequency of the circuit; and estimate an amount of wafer bow based on the estimated capacitance of the wafer to the surface of the platen.

In some embodiments, the controller is further configured to generate an alert that indicates the wafer state characteristics. In some embodiments, the alert indicates that the wafer is declamped from the surface of the platen. In some embodiments, the alert indicates an amount of estimated wafer bow.

In some embodiments, the plurality of electrodes comprises three or more electrodes, and the controller is further configured to: cause a second input signal to be injected in a second input side of the circuit, wherein the second input side corresponds to the second electrode of the plurality of electrodes; and measure characteristics of a second output signal at a second output side of the circuit, wherein the second output side corresponds to a third of the plurality of electrodes.

In some embodiments, the plurality of electrodes comprises three or more electrodes, and the controller is further configured to measure two or more output signals at two or more output sides of the circuit, and wherein the two or more output sides correspond to electrodes of the plurality of electrodes other than the first electrode of the plurality of electrodes.

According to some embodiments, a method for wafer state detection is provided, the method comprising: causing an input signal to be injected in an input side of a circuit associated with a plurality of electrodes of an ESC, an RF blocking filter associated with the ESC, and a DC blocking filter associated with the ESC, wherein the input side corresponds to a first electrode of the plurality of electrodes; measuring characteristics of an output signal at an output side of the circuit, wherein the output side corresponds to a second electrode of the plurality of electrodes; and calculating wafer state characteristics of a wafer positioned on a surface of a platen of the ESC based on the characteristics of the output signal.

In some embodiments, the input signal has a carrier frequency corresponding to a resonant frequency of the circuit, wherein the resonant frequency is determined during a calibration process of the circuit. In some embodiments, the resonant frequency is identified based on an operating temperature of the ESC. In some embodiments, the method further comprises calculating a difference between a phase of the output signal and a phase of the input signal, wherein the wafer state characteristics are calculated based on the difference. In some embodiments, calculating the wafer state characteristics comprises calculating an amount of wafer bow of the wafer using a best fit model that relates the difference between the phase of the output signal and the phase of the input signal to the amount of wafer bow. In some embodiments, the best fit model is an exponential function.

In some embodiments, calculating the wafer state characteristics comprises: identifying a resonant frequency of the circuit associated with the plurality of electrodes, the RF blocking filter, and the DC blocking filter with the wafer positioned on the surface of the platen; calculating an estimated capacitance of the wafer to the surface of the platen using a first best fit model that relates the resonant frequency of the circuit to the estimated capacitance of the wafer to the surface of the platen; and calculating an amount of wafer bow of the wafer using a second best fit model that relates the estimated capacitance of the wafer to the surface of the platen to the amount of wafer bow. In some embodiments, coefficients of the second best fit model are based on a spherical model of wafer bow. In some embodiments, the second best fit model is a polynomial function.

DETAILED DESCRIPTION

Terminology

Figure 1:
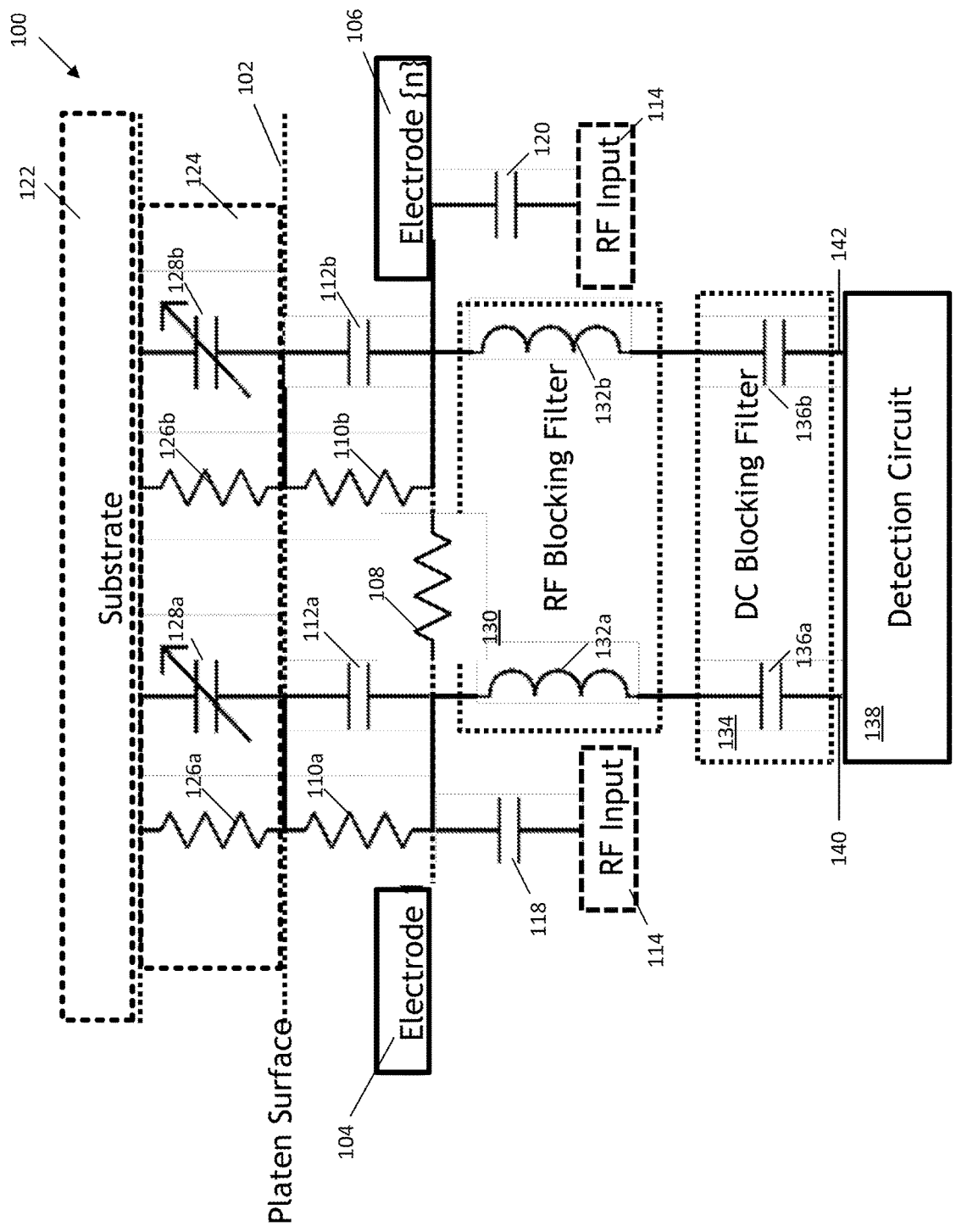
FIG. 1 presents a schematic diagram of a system for wafer state detection in accordance with some embodiments.

The following terms are used throughout the instant specification:

The terms "semiconductor wafer," "wafer," "substrate," "wafer substrate" and "partially fabricated integrated circuit" may be used interchangeably. Those of ordinary skill in the art understand that the term "partially fabricated integrated circuit" can refer to a semiconductor wafer during any of many stages of integrated circuit fabrication thereon. A wafer or substrate used in the semiconductor device industry typically has a diameter of 200 mm, or 300 mm, or 450 mm. Besides semiconductor wafers, other work pieces that may take advantage of the disclosed embodiments include various articles such as printed circuit boards, magnetic recording media, magnetic recording sensors, mirrors, optical elements, display devices or components such as backplanes for pixelated display devices, flat-panel displays, micro-mechanical devices and the like. The work piece may be of various shapes, sizes, and materials.

A "semiconductor device fabrication operation" as used herein is an operation performed during fabrication of semiconductor devices. Typically, the overall fabrication process includes multiple semiconductor device fabrication operations, each performed in its own semiconductor fabrication tool such as a plasma reactor, an electroplating cell, a chemical mechanical planarization tool, a wet etch tool, and the like. Categories of semiconductor device fabrication operations include subtractive processes, such as etch processes and planarization processes, and material additive processes, such as deposition processes (e.g., physical vapor deposition, chemical vapor deposition, atomic layer deposition, electrochemical deposition, electroless deposition). In the context of etch processes, a substrate etch process includes processes that etch a mask layer or, more generally, processes that etch any layer of material previously deposited on and/or otherwise residing on a substrate surface. Such an etch process may etch a stack of layers in the substrate.

"Manufacturing equipment" refers to equipment in which a manufacturing process takes place. Manufacturing equipment often has a process chamber in which the workpiece resides during processing. Typically, when in use, manufacturing equipment performs one or more semiconductor device fabrication operations. Examples of manufacturing equipment for semiconductor device fabrication include deposition reactors such as electroplating cells, physical vapor deposition reactors, chemical vapor deposition reactors, and atomic layer deposition reactors, and subtractive process reactors such as dry etch reactors (e.g., chemical and/or physical etch reactors), wet etch reactors, and ashers.

An "electrostatic chuck" (ESC) as used herein refers to a chuck that uses electrostatic force to clamp a wafer to the chuck during processing. The ESC may use one or more electrodes. Voltages may be applied to each of the one or more electrodes. The applied voltage may cause current to flow, thereby causing charge to migrate through a dielectric layer between the chuck and a wafer or substrate being processed. Opposite charges accumulated at an electrode relative to the wafer therefore cause the wafer to be gripped or clamped to the chuck by the electrostatic force. In some cases, the electrodes may be integrated into the ESC, or may be separate from the ESC. In some embodiments, the ESC may refer to the electrodes that generate the electrostatic force.

A "platen" as used herein refers to a top surface of an ESC on which a wafer undergoing fabrication is positioned. There may be a gap between the wafer and the platen surface (e.g., the upper surface), which is generally referred to herein as "d."

A "pedestal" as used herein may refer to a structure or housing that supports, or includes, the platen.

"Wafer bow" as used herein may refer to a deformation of a wafer. Wafer bow may occur during fabrication, for example, as a result of stress to the wafer during deposition of materials on an active surface of a wafer substrate. Wafer bow may occur during various types of fabrication, such as when large stacks of materials are deposited. Wafer bow may cause complications in subsequent processing steps. For example, the wafer may fail to chuck correctly if an amount of bowing is too large. Moreover, some processing steps (e.g., photolithography) may produce poor results if performed on a wafer that is excessively bowed.

Wafer bow may be measured as a deviation of the mean or median distance of the surface of the wafer to a reference plane. The point of the median surface of the wafer may be the center point (e.g., in the case of concave or domed bowing), or an edge point of the wafer and/or an average edge point of the wafer (e.g., in the case of warping or convex bowing).

"Wafer declamping" as used herein refers to a state where a wafer is no longer clamped to a platen of an electrostatic chuck (ESC). As used herein, when wafer bow is detected, or more than a threshold amount of wafer bow is detected, during fabrication or processing of a wafer, the wafer can be considered declamped from the ESC. It should be noted that, as used herein, wafer bow may be associated with a numeric value that indicates a degree of bowing. By contrast, wafer declamping may be a binary classification that indicates whether or not a wafer is clamped to the platen.

Overview

Apparatuses, systems, methods, and media for detecting and/or quantifying wafer bow are provided.

A wafer may be positioned on a platen (e.g., a platen of an ESC). The wafer may undergo warping, deformation, or bow. In some embodiments, wafer state characteristics, such as whether the wafer is bowed and/or an amount of bowing, may be calculated.

In some embodiments, wafer state characteristics may be calculated by a controller that is configured to calculate the wafer state characteristics. The controller may include logic or circuitry that is used to receive, transmit, and/or process data. In some embodiments, the controller may include digital components, such as a microcontroller, an embedded computer, or the like. In some embodiments, the controller may include analog components. For example, the controller may include a proportional-integral-derivative (PID) controller to identify a resonant frequency of the circuit. In some embodiments, a PID controller may include one or more operational amplifiers. In some embodiments, the controller may be included in a housing of a power supply of an ESC. The wafer state characteristics may indicate an amount of wafer bow and/or whether or not a wafer is declamped from a chuck. For example, an amount of wafer bow may be expressed as a mean or median distance of a point on a wafer surface to a reference plane.

In some embodiments, a controller may be configured to determine wafer state characteristics based on characteristics of a circuit defined by a wafer to a platen surface, one or more RF blocking filters, and/or one or more DC blocking filters. Such a circuit may have a resonant frequency that is dependent on a gap between the wafer and the platen surface. For example, in some embodiments, a resonant frequency of the circuit may depend on a capacitance of the wafer to the platen surface. The capacitance of the wafer to the platen surface may be dependent on a gap between the wafer and the platen surface, i.e., wafer bow. Accordingly, a resonant frequency of a circuit, or characteristics of a circuit operating at or near the resonant frequency of the circuit, may be used to estimate wafer bow.

As an example, in some embodiments, a controller may determine wafer state characteristics based on a resonant frequency of the circuit. As a more particular example, the controller may estimate a capacitance of a wafer to a platen surface based on the resonant frequency. Continuing with this more particular example, the controller may estimate an amount of wafer bow based on the capacitance.

As another example, in some embodiments, a controller may be configured to calculate the wafer state characteristics based on characteristics of an output signal at an output side of a circuit. The characteristics of the output signal may be differences between the output signal and an input signal injected at an input side of the circuit (e.g., differences in phase and/or differences in magnitude). In some embodiments, the input signal may have a carrier frequency that corresponds to a resonant frequency (e.g., such that the carrier frequency is at or near the resonant frequency) of the circuit. In some embodiments, an amount of wafer bow may be estimated based on a difference in phase and/or a difference in magnitude between the input signal and the output signal, when the input signal has a carrier frequency at, or near, the resonant frequency of the circuit.

In some embodiments, characteristics of a circuit and/or of an output signal at an output side of the circuit can be used to detect wafer bow and/or to quantify wafer bow using one or more best fit models. For example, in some embodiments, a value of the resonant frequency of the circuit may be used to estimate a capacitance of a wafer to an upper surface of a platen. The capacitance may in turn be used to estimate an amount of wafer bow, for example, using a best fit model. As another example, in some embodiments, an amount of wafer bow can be estimated based on a magnitude difference and/or a phase difference between the output signal and a corresponding input signal using a best fit model, where the input signal has a carrier frequency corresponding to the resonant frequency of the circuit. In other words, when operating at, or near, the resonant frequency, magnitude and/or phase differences of the output signal relative to the input signal may indicate a gap between a wafer and a platen surface and/or an amount of wafer bowing. In some embodiments, the phase difference can be used to estimate wafer bow using a best fit model. In some embodiments, coefficients of best fit models may be identified using experimental data.

Identifying Wafer State Characteristics

In some embodiments, an apparatus is used to detect wafer bow and/or to estimate an amount of wafer bow. The apparatus may include a controller, which may be coupled to two or more electrodes of an ESC via an RF blocking filter and/or a DC blocking filter. The controller may be configured to identify a resonant frequency associated with a circuit that includes the ESC, the RF blocking filter, and the DC blocking filter. The controller may be configured to cause an input signal having a carrier frequency to be injected into an input side of the circuit. In some embodiments, the input side of the circuit may correspond to a first electrode of the two or more electrodes. The controller may be configured to measure an output signal at one or more of the remaining electrodes other than the first electrode. In embodiments in which the controller is configured to measure the output signal at two or more electrodes other than a first electrode at which an input signal is injected, the measured output signals may be multiplexed. The controller may be configured to calculate wafer state characteristics of a wafer positioned on a platen associated with the ESC based on the characteristics of the output signal.

In some embodiments, the controller may be configured to calculate wafer state characteristics based on a difference in magnitude or phase of a measured output signal relative to an input signal. For example, in some embodiments, the controller may be configured to estimate a capacitance between a surface of a platen to a wafer positioned on the platen. Continuing with this example, the controller may be configured to estimate wafer bow based on the estimated capacitance. Note that techniques for estimating wafer bow based on estimated capacitance are shown in and described below in connection with FIG. 4. As another example, in some embodiments, the controller may be configured to estimate wafer bow based on a difference in phase between the output signal and the input signal. Note that techniques for estimating wafer bow based on a phase difference between the output signal and the input signal are shown in and described below in connection with FIG. 5.

In some embodiments, wafer state characteristics may be determined once manufacturing equipment associated with the ESC has reached a desired operating temperature.

In some embodiments, a controller, an RF blocking filter, and a DC blocking filter may be housed together. For example, the controller, the RF blocking filter, and the DC blocking filter may be housed together as part of a power supply for an ESC.

FIG. 1 shows a schematic diagram 100 of an example system in which a wafer state detection circuit can be implemented in connection with an ESC in accordance with some embodiments.

An ESC can have a platen surface 102. The ESC may have N electrodes as shown in FIG. 1 (e.g., depicted as electrodes 104 and 106). N may be one, two, four, ten, etc. The resistance between the electrodes is depicted as resistance 108. Resistance from the electrodes to the platen surface is depicted as resistances 110a and 110b. Capacitances from the electrodes to the platen surface are depicted as capacitances 112a and 112b. In some embodiments, capacitances 112a and 112b may be within a range of about 50 pF-700 pF, within a range of about 150 pF-500 pF, within a range of about 200 pF-400 pF, or the like.

Figure 8:
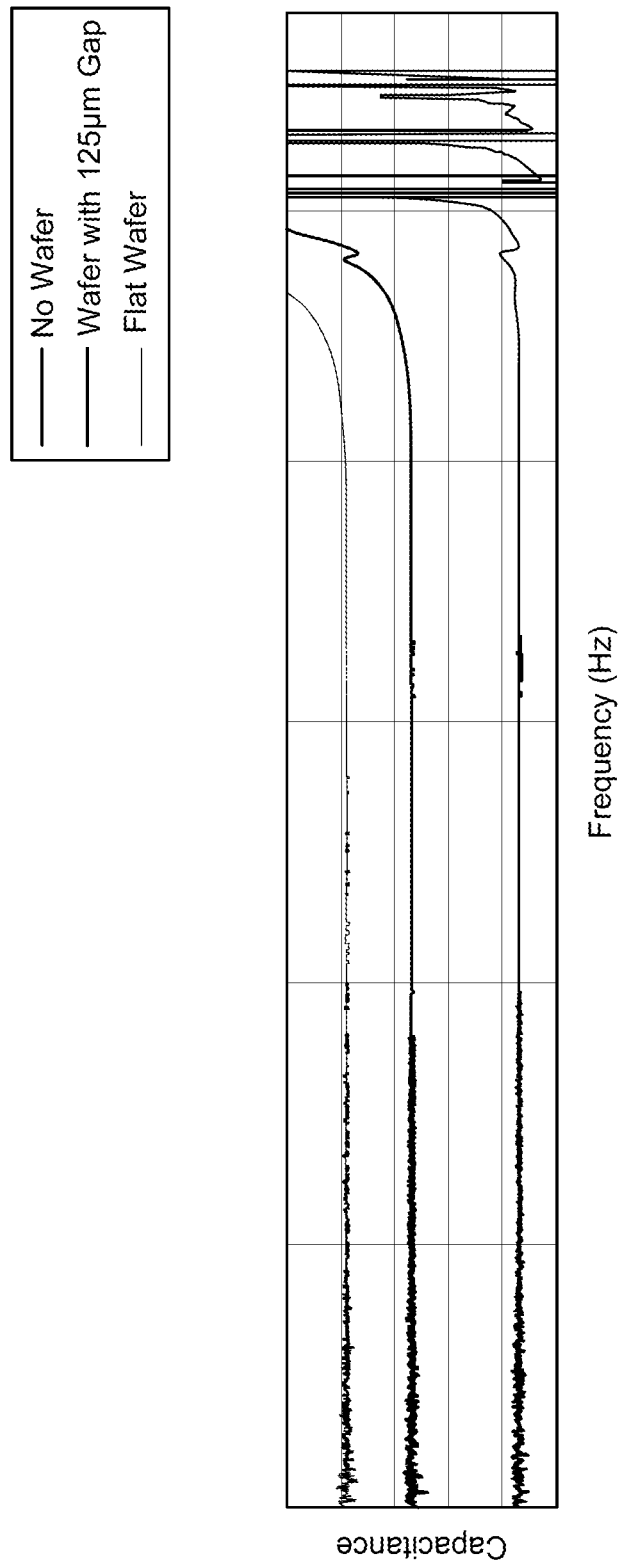
FIG. 8 presents an example graph that illustrates that a capacitance between electrodes of an electrostatic chuck to a wafer is stable across a range of frequencies in accordance with some embodiments.

The capacitances from an electrode to the upper surface of the platen (e.g., capacitances 112a and 112b) may be relatively stable across different frequencies and for a particular wafer positioning state. FIG. 8 depicts a graph that illustrates stability of the capacitances as a function of input signal carrier frequency. As illustrated, for a given wafer positioning state, capacitance is stable up to a relatively high frequency (e.g., 10-15 Mhz), at which point capacitance may be difficult to measure.

A voltage may be applied to each electrode via a corresponding RF input. For example, voltage may be applied to electrode 104 via an RF input 114. The RF input may be coupled to an electrode via a coupling capacitor. For example, RF input 114 is coupled to electrode 104 via a coupling capacitor 118. Similarly, RF input 114 is coupled to electrode 106 via a coupling capacitor 120. In some embodiments, values of coupling capacitors 118 and/or 120 may be selected based on an RF operating frequency of the system.

A wafer 122 having a substrate may be positioned on the platen surface during fabrication. There may be a gap 124 between wafer 122 and platen surface 102. The resistance between platen surface 102 and wafer 122 is depicted as resistances 126a and 126b. The resistance(s) between platen surface 102 and wafer 122 may be dependent on various parameters, such as temperature, incoming films on the substrate, or pre-deposited films on the platen.

The capacitance between platen surface 102 and wafer 122 is depicted as variable capacitors 128a and 128b. Values of the capacitance between platen surface 102 and wafer 122 may depend on various parameters, such as lateral position of wafer 122 and/or an amount of bowing of wafer 122. Note that techniques for estimating the capacitance between platen surface 102 and wafer 122 are shown in and described below in connection with FIG. 4. The capacitance between platen surface 102 and wafer 122 is sometimes referred to as ('w herein.

A detection circuit 138 can be coupled to the ESC via an RF blocking filter 130 and a DC blocking filter 134. Detection circuit 138 may be configured to estimate wafer state characteristics for a wafer and/or a wafer and substrate (e.g., wafer 122) positioned on the surface of platen 102. For example, detection circuit 138 may be configured to cause an input signal to be injected at an input side 140. As illustrated, input side 140 may correspond to electrode 104. The input signal may have a carrier frequency that is a resonant frequency of the circuit formed by DC blocking filter 134, RF blocking filter 130, the platen, and the capacitance between wafer 122 and platen surface 102. Detection circuit 138 may then measure an output signal at an output side 142. As illustrated, output side 142 may correspond to electrode 106. Although not shown, the output signal may be measured across an output load (e.g., 1 kΩ resistor, a 2 kΩ resistor, etc.). In some embodiments, detection circuit 138 may be configured to estimate wafer state characteristics based on a comparison of a phase of the output signal relative to a phase of the input signal.

In some embodiments, detection circuit 138 may include a controller (e.g., a microcontroller) and/or a memory for storing data, programs for performing a wafer position detection process, programs for performing calibration processes, etc. For example, the controller may include various logic and/or detection circuitry configured to receive data, transmit data, process data (e.g., perform various calculations, make various determinations, or the like), cause input signals to be applied to a circuit, measure output signals, or the like.

RF blocking filter 130 can be configured to block a range of RF frequencies. The range of RF frequencies may be in the range of 200 kHz-100 MHZ. In some embodiments, RF blocking filter 130 can include one or more inductors, such as inductors 132a and 132b. In some embodiments, inductors 132a and 132b may be ferrite-core inductors.

In some embodiments, DC blocking filter 134 may include one or more blocking capacitors, such as blocking capacitors 136a and 136b. Values of capacitors 136a and/or 136b may be selected subject to various criteria. For example, values of capacitors 136a and/or 136b may be selected such that the capacitance is minimized while still allowing DC blocking filter 134 to be coupled to RF blocking filter 130. In some embodiments, values of capacitors 136a and/or 136b may be substantially similar to values of coupling capacitors 118 and 120. For example, in some embodiments, values of capacitors 136a and/or 136b may be of a same order of magnitude as coupling capacitors 118 and 120.

In some embodiments, RF blocking filter 130, DC blocking filter 134, and detection circuit 138 may be housed together. For example, RF blocking filter 130, DC blocking filter 134, and detection circuit 138 may be housed together in a power supply for the ESC.

Figure 2:
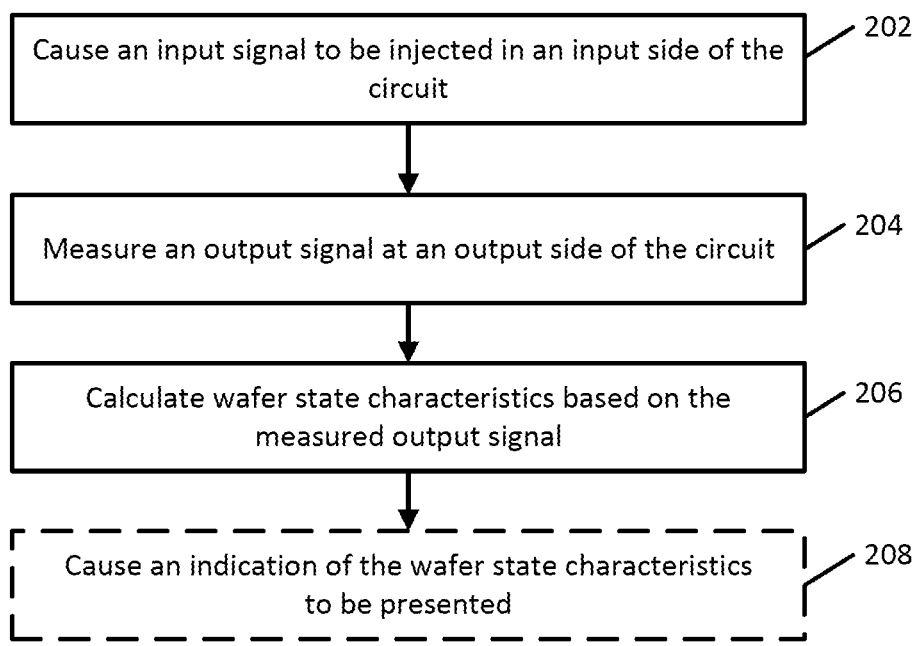
FIG. 2 presents an example of a process for calculating wafer state characteristics in accordance with some embodiments.

FIG. 2 shows an example of a process 200 for calculating wafer state characteristics in accordance with some embodiments. In some embodiments, blocks of process 200 can be executed by a controller, such as a controller of detection circuit 138 as shown in and described above in connection with FIG. 1. It should be noted that, in some embodiments, blocks of process 200 may be performed in orders not shown in FIG. 2. In some embodiments, two or more blocks of process 200 may be performed substantially in parallel. Additionally, it should be noted that, in some embodiments, one or more blocks of process 200 may be omitted.

At 202, the controller can be configured to cause an input signal to be injected at an input side of the circuit. In some embodiments, the input side of the circuit can correspond to a first electrode of two or more electrodes of the ESC.

At 204, the controller can be configured to measure an output signal at an output side of the circuit. The output side can correspond to one or more electrodes of the ESC other than the first electrode at which the input signal was injected. For example, in some embodiments, the output side can be a second electrode that is different than the first electrode. As another example, in some embodiments, the output side can correspond to two or more electrode that are each different than the first electrode. In some such embodiments, the output signal can be a multiplexed signal.

It should be noted that, in some embodiments, the input signal may have a carrier frequency that corresponds to, or is substantially near, a resonant frequency of the circuit. In some embodiments, the resonant frequency may have been determined using no wafer or a bare silicon wafer during a calibration procedure (e.g., as shown in and described below in connection with FIG. 3). In some embodiments, the controller may be configured to determine wafer state characteristics based on differences in magnitude and/or phase of the output signal relative to the input signal at block 206, and as described below in connection with FIG. 5. Alternatively, in some embodiments, the controller may loop through blocks 202 and 204 multiple times to identify the resonant frequency of the circuit with the wafer undergoing fabrication placed on the platen. For example, in some embodiments, the controller can identify the resonant frequency based on a comparison of the phase and/or magnitude of the output signal to the phase and/or magnitude of the input signal. In some embodiments, the controller can loop through block 202 and 204 until the resonant frequency is identified. In some such embodiments, the resonant frequency of the circuit with the wafer undergoing fabrication on the platen may be used to estimate a capacitance of the wafer to the platen surface. The capacitance of the wafer to the platen surface may be used to estimate wafer bow at block 206, and as described below in connection with FIG. 4.

At 206, the controller can be configured to calculate wafer state characteristics based on the measured output signal.

In some embodiments, the wafer state characteristics can include a determination that wafer bow is detected. In some embodiments, the wafer state characteristics can additionally or alternatively include a determination of an amount of detected wafer bow, for example, in micrometers. In some embodiments, the wafer state characteristics can include a lateral position of the wafer. For example, in some embodiments, a lateral position of the wafer may indicate a lateral shift of a point of a wafer surface relative to a center point of a platen.

In some embodiments, the wafer state characteristics can be determined based on a value of a resonant frequency of the circuit. For example, in some embodiments, a capacitance of the wafer to an upper surface of the platen may be estimated based on the resonant frequency of the circuit, as shown in and described below in connection with FIG. 4. Continuing with this example, in some embodiments, an amount of wafer bow may be estimated based on the estimated capacitance.

In some embodiments, the wafer state characteristics can be determined based on differences between the output signal and the input signal. For example, differences between the output signal and the input signal can include a difference between a magnitude of the output signal relative to the input signal and/or a difference between a phase of the output signal relative to the input signal. Continuing with this example, in some embodiments, the controller can be configured to estimate an amount of wafer bow based on a phase difference of the output signal relative to the input signal (e.g., without estimating an intermediate capacitance of the wafer to the platen surface).

Note that techniques for estimating an amount of wafer bow are shown in and described below in connection with FIGS. 4 and 5.

At 208, the controller can be configured to cause an indication of the wafer state characteristics to be presented.

In some embodiments, the indication can be presented via a message presented on a display associated with operation of the ESC. In some such embodiments, the controller can transmit instructions to a such a display that cause the indication to be presented on the display.

In some embodiments, the indication of the wafer state characteristics can indicate whether the wafer is clamped or declamped. For example, in some embodiments, the controller can be configured to determine that the wafer is declamped in response to determining than an estimated amount of wafer bow exceeds a threshold amount of bow (e.g., 50 µm, 100 µm, etc.). Continuing with this example, in some embodiments, the controller can be configured to present a message that indicates a clamping status of the wafer as either "clamped," or "declamped."

In some embodiments, the indication of the wafer state characteristics can additionally or alternatively indicate an estimated amount of wafer bow (e.g., 50 µm, 100 µm, etc.).

In some embodiments, the controller may be configured to cause an indication of wafer clamping status to be presented as a default setting. In some such embodiments, such a default setting may be overridden to present an indication of an estimated amount of wafer bow by a user.

It should be noted that, in some embodiments, block 208 may be omitted.

In some embodiments, the controller can be configured to loop back to block 202 and cause a second input signal having the resonant frequency to be injected. In some embodiments, the second input signal may be injected at an input side corresponding to a second electrode that was previously used at block 204 to measure the output signal. Alternatively, in instances in which the ESC includes three or more electrodes, the input signal may be injected at an input side that corresponds to an electrode that was previously not used for either injecting the input signal or measuring the output signal. In some such instances, comparisons of output signals from different electrodes may be used to determine lateral positioning of the wafer. In some embodiments, the controller can be configured to loop through all available electrodes such that all available electrodes are used for injecting the input signal.

Identifying Resonant Frequencies

In some embodiments, a resonant frequency may depend on various factors, such as an operating temperature, materials of the platen, a number of electrodes, etc. A resonant frequency may therefore be determined for a particular piece of equipment and for a particular operating temperature.

In some embodiments, a resonant frequency may be identified using a calibration process. In some embodiments, the calibration process may be performed using the piece of equipment and at the operating temperature at which the resonant frequency is to be applicable.

In some embodiments, a calibration process may be performed with a bare wafer (e.g., a bare silicon (Si) wafer) positioned on a platen of the ESC and/or a flat wafer (e.g., known to be properly clamped to the platen). It should be noted that the flat wafer may or may not be bare. For example, in some embodiments, a flat wafer may have undergone some processing (e.g., masking, lithography, deposition, etching, or the like). The processing may produce a partially fabricated integrated circuit.

In some embodiments, a calibration process may be performed when a piece of equipment is first started or when the piece of equipment is restarted.

Figure 3:
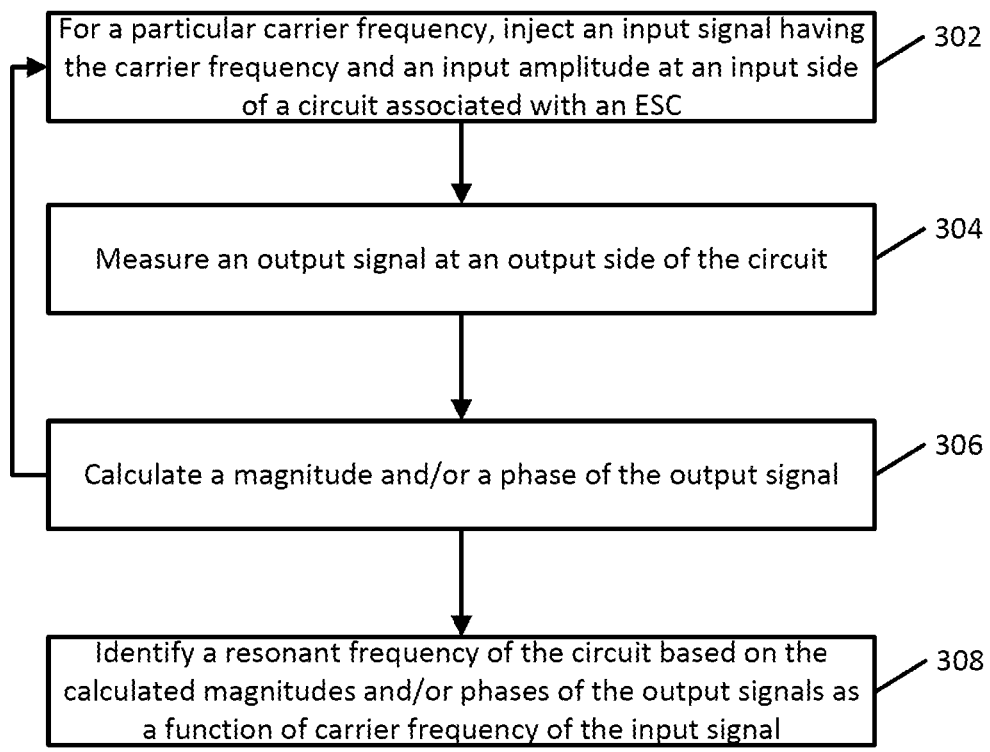
FIG. 3 presents an example of a process for calibrating a system for calculating wafer state characteristics in accordance with some embodiments.

FIG. 3 shows an example of a process 300 for identifying a resonant frequency of a circuit associated with an ESC in accordance with some embodiments. In some embodiments, blocks of process 300 can be executed by a controller, such as a controller of a detection circuit as shown in and described above in connection with FIG. 1. It should be noted that, in some embodiments, blocks of process 300 can be performed in various orders not shown in FIG. 3. Additionally, it should be noted that, in some embodiments, one or more blocks of process 300 can be omitted.

At 302, the controller can be configured to, for a particular carrier frequency, cause an input signal having the carrier frequency and an input amplitude to be injected at an input side of the circuit. In some embodiments, the carrier frequency can be a carrier frequency that is identified as being close to a predicted or likely resonant frequency of the circuit. For example, the carrier frequency can be a frequency that is a predetermined amount (e.g., 1 kHz, 2 KHz, etc.) below a predicted or likely resonant frequency.

At 304, the controller can be configured to measure an output signal at an output side of the circuit. In some embodiments, the output signal can be measured at one or more electrodes other than the electrode used to inject the input signal. In some embodiments, the output signal can be measured with respect to a load (e.g., 1 kΩ resistor, a 2 kΩ resistor, etc.) coupled to the electrodes.

At 306, the controller can be configured to measure a magnitude and/or a phase of the output signal with respect to a received response.

Process 300 can then loop back to 302. The controller can cause an input signal having a different carrier frequency to be injected into the input side of the circuit. In some embodiments, process 300 can loop through blocks 302-306 such that a series of input signals, each corresponding to a carrier frequency in a series of carrier frequencies, are injected. In some embodiments, the series of carrier frequencies is selected to span a likely resonant frequency that is to be identified. For example, in an instance in which the likely resonant frequency is about 13 kHz, process 300 can loop through a series of carrier frequencies that span 13 kHz, such as a range from about 12 kHz to 14 kHz, a range from about 12.5 kHz to 13.5 kHz, and the like. In some embodiments, frequencies in the series of carrier frequencies can each be separated by a frequency step. Such a frequency step may be 100 Hz, 500 Hz, etc.

At 308, the controller can be configured to identify a resonant frequency of the circuit based on the calculated magnitudes and/or phases of each output signal as a function of carrier frequency of the input signal. For example, in some embodiments, the controller can be configured to identify the resonant frequency of the circuit as the carrier frequency for which the magnitude of the output signal is largest. Additionally or alternatively, in some embodiments, the controller can be configured to identify the resonant frequency of the circuit as the carrier frequency for which the phase difference between the input signal and the corresponding output signal is smallest.

Estimating Wafer Bow

Wafer bow can be detected and/or estimated based on characteristics of a circuit that includes a wafer on a platen, one or more RF blocking filters, and/or one or more DC blocking filters. For example, in some embodiments, wafer bow can be detected and/or estimated based on a resonant frequency of the circuit. As a more particular example, in some embodiments, wafer bow can be detected and/or estimated based on an estimated capacitance of a wafer to a platen surface, where the capacitance is estimated based on a resonant frequency of the circuit. Wafer bow can then be estimated based on the estimated capacitance of the wafer to the platen surface.

Figure 7:
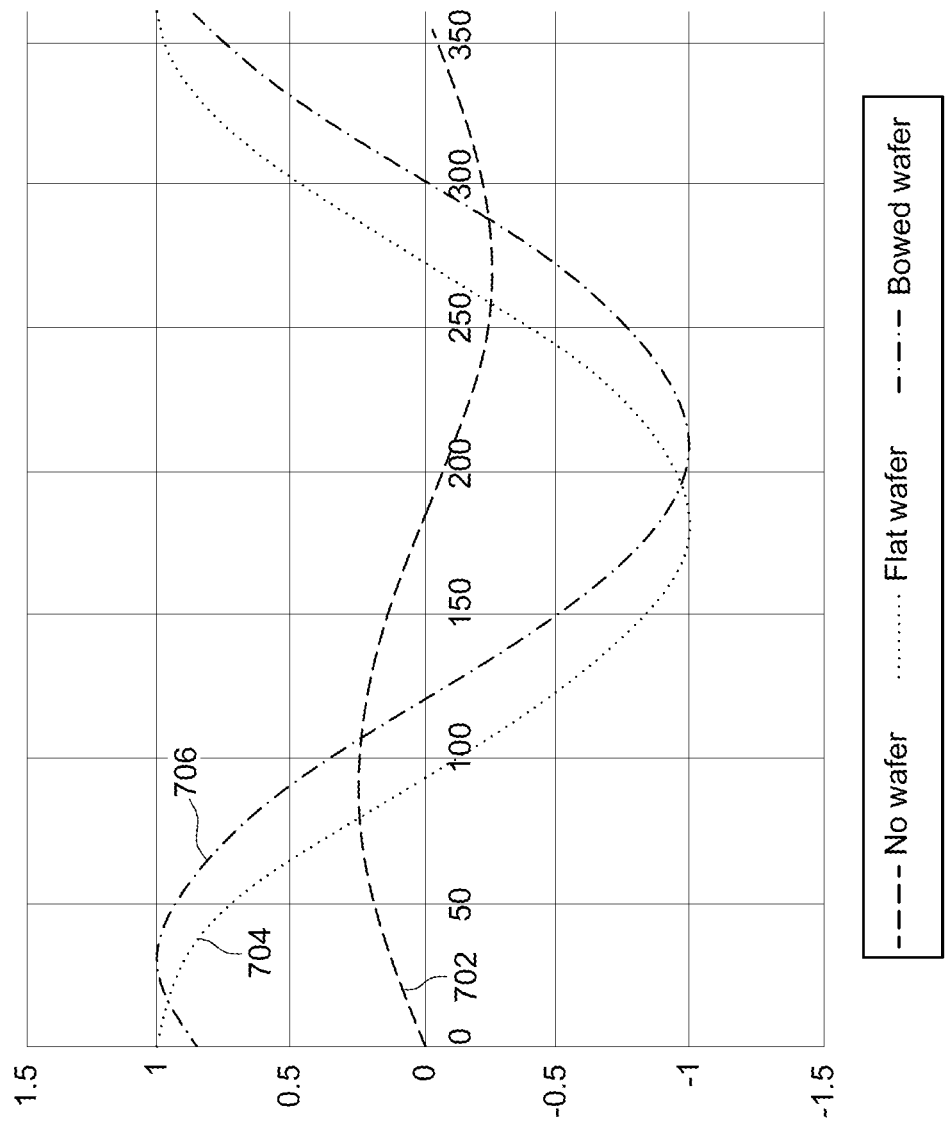
FIG. 7 presents an example graph that illustrates phase differences of output signals relative to input signals for different amounts of wafer bow in accordance with some embodiments.

As another example, in some embodiments, wafer bow can be detected and/or estimated based on characteristics of an output signal resulting from an injected input signal having a carrier frequency corresponding to a resonant frequency of the circuit. As a more particular example, in some embodiments, wafer bow can be detected and/or quantified based on a magnitude difference and/or a phase difference between an output signal measured at an output side of a circuit in response to an input signal injected in an input side of the circuit, where the input signal has a carrier frequency corresponding to a resonant frequency of the circuit. That is, the phase difference between the output signal and the input signal may indicate an amount of wafer bow:

FIG. 7 shows an example of output signals that can be measured in response to injection of an input signal having a carrier frequency corresponding to a resonant frequency of a circuit. In the example of FIG. 7, a curve 702 shows an output signal measured with no wafer, a curve 704 shows an output signal measured with a flat wafer, and a curve 706 shows an output signal measured with a bowed wafer. As illustrated in FIG. 7, there is a phase difference between curve 706 and curve 704. In some embodiments, this phase difference may be used to estimate wafer bow.

In some embodiments, wafer bow may be estimated using one or more best fit models. For example, in some embodiments, a best fit model may relate an estimated capacitance between a wafer and a platen to an estimated amount of wafer bow. As another example, in some embodiments, a best fit model may relate a measured magnitude and/or phase difference between an output signal and an input signal to an estimated amount of wafer bow.

In some embodiments, any best fit models that are used to estimate wafer bow may be specific to particular environments or equipment. For example, a best fit model may be specific to a particular model of ESC or to particular components of the ESC. As another example, a best fit model may be specific to a particular operating temperature. As a more particular example, a first best fit model may be applicable at 450° C., and a second best fit model may be applicable at 650° C. In some embodiments, one or more applicable best fit models may be identified prior to estimation of wafer bow. For example, one or more best fit models applicable to a particular operating temperature may be identified.

It should be noted that a best fit model may be associated with any suitable type of function, such as a linear function, a polynomial function (e.g., of order 2, of order 3, of order 4, of order 5, etc.), an exponential function, and the like.

Figure 6:
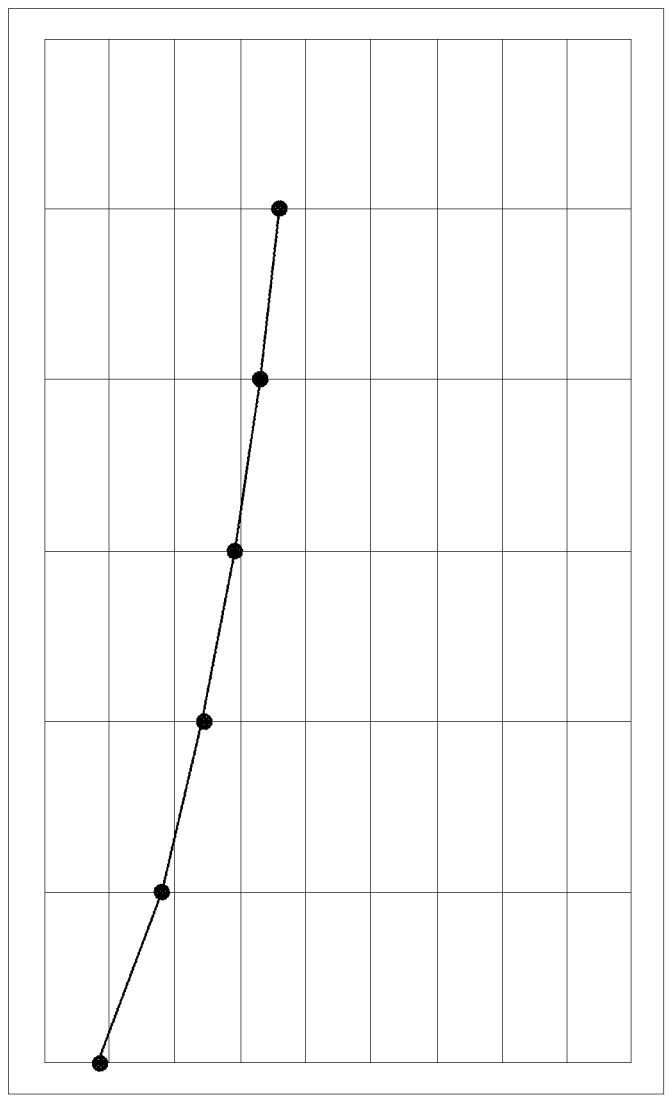
FIG. 6 presents an example graph that depicts an example relationship of estimated capacitances from a platen surface to a substrate as a function of wafer gap in accordance with some embodiments.

In some embodiments, coefficients for a best fit model that relate an estimated capacitance between a wafer and a platen surface to an amount of wafer bow may be calculated using a spherical model of wafer bowing (e.g., as shown in and described below in connection with FIGS. 9A, 9B, and 9C). In some embodiments, a spherical model of bowing may be used to generate a series of (capacitance, wafer bowing) pairs from which a best fit model can be generated. FIG. 6 shows an example graph that illustrates a relationship between estimated capacitance between a wafer and a platen and an amount of wafer bow that can be used to calculate coefficients for a best fit model.

In some embodiments, coefficients for a best fit model that relate a measured magnitude and/or phase difference of output signals relative to input signals to estimated wafer bow may be calculated using experimental data. Such experimental data may include a group of experimental wafers each having a different amount of bow and associated magnitude and/or phase differences. Coefficients for the best fit model may then be calculated based on the experimental data.

In some embodiments, a controller (e.g., a controller of detection circuit 138 as shown in FIG. 1) can be configured to detect and/or estimate wafer bow. In some embodiments, the controller can be configured to detect and/or estimate wafer bow at a particular temperature. For example, the controller can be configured to detect and/or estimate wafer bow in response to determining that a process temperature has been reached. In some embodiments, the controller may have been configured to identify a resonant frequency for the circuit that corresponds to the process temperature, for example, by retrieving the resonant frequency corresponding to the process temperature from a memory associated with the controller.

Figure 4:
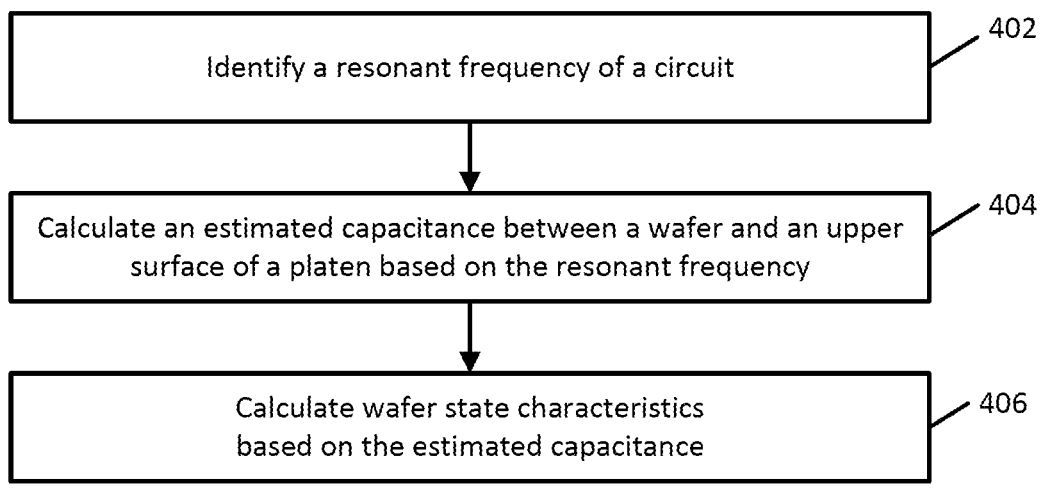
FIG. 4 presents one example of a process for calculating wafer state characteristics in accordance with some embodiments.

FIG. 4 shows an example of a process 400 for calculating wafer state characteristics based on an estimated capacitance of a wafer to a platen surface in accordance with some embodiments. In some embodiments, blocks of process 400 can be executed by a controller (e.g., a controller of detection circuit 138 of FIG. 1) associated with an ESC. It should be noted that, in some embodiments, blocks of process 400 may be performed in orders not shown in FIG. 4. In some embodiments, two or more blocks or process 400 may be performed substantially in parallel. Additionally or alternatively, in some embodiments, one or more blocks of process 400 may be omitted.

At 402, the controller can be configured to identify or estimate a resonant frequency of the circuit. It should be noted that the resonant frequency corresponds to a resonant frequency of the circuit that includes one or more electrodes associated with the ESC, the RF blocking filter, the DC blocking filter, and the wafer undergoing fabrication.

The resonant frequency may be identified or estimated based on characteristics of an output signal measured at an output side of a circuit relative to an input signal injected at an input side of the circuit. In some embodiments, the input signal can be injected at an input side corresponding to a first electrode of a group of electrodes of the ESC. In some embodiments, the output signal can be measured at an output side corresponding to one or more electrodes of the group of electrodes other than the first electrode. The input signal may have a carrier frequency that is near a likely resonant frequency of the circuit.

In some embodiments, the resonant frequency may be identified or estimated based on a magnitude difference and/or a phase difference between the output signal and the input signal. In some embodiments, the magnitude difference can be calculated as a ratio of an amplitude of the output signal to an amplitude of the input signal. In some embodiments, the phase difference can be calculated as a difference of a phase of the output signal relative to a phase of the input signal. In some embodiments, the resonant frequency be identified or estimated as the input signal carrier frequency that generates an output signal having the highest amplitude relative to the input signal and/or the smallest phase difference relative to the input signal.

At 404, the controller can be configured to calculate an estimated capacitance between a wafer and a platen on which the wafer is positioned. Note that examples of the capacitance between the wafer and the platen are shown as variable capacitances 128a and 128b in FIG. 1.

In some embodiments, the capacitance between the wafer and the platen can be calculated based on the resonant frequency $f_0$, where $$f_0 \approx \frac{1}{2\pi\sqrt{2L_F\left(\frac{C_{RF}}{n} + \frac{C_W}{n}\right)}},$$

where $L_F$ denotes an inductance of the RF blocking filters, $C_{RF}$ denotes a capacitance of an RF input to the clamping electrodes (e.g., capacitors 118 and/or 120 of FIG. 1), and $C_w$ denotes the total series capacitance of the wafer to the electrode (wafer to platen surface and the platen surface to the electrode) (e.g., capacitances 128a and/or 128b of FIG. 1). In some such embodiments, $C_w$ can be solved for to estimate the capacitance between the wafer and the platen.

At 406, the controller can be configured to calculate wafer state characteristics based on the estimated capacitance. For example, in some embodiments, the controller can calculate an estimated amount of wafer bow based on the estimated capacitance. As another example, in some embodiments, the controller can be configured to determine that the wafer is declamped based on a determination that an estimated amount of wafer bow exceeds a threshold.

In some embodiments, the wafer state characteristics can be calculated using a best fit model that relates the estimated capacitance (e.g., $C_w$ in the example above) to an amount of wafer bow. In some embodiments, the best fit model may be an $n^{th}$ order polynomial (e.g., third order, fourth order, fifth order, sixth order, or the like). In some embodiments, the coefficients of such a best fit model may be determined based on experimental data. Additionally or alternatively, in some embodiments, the coefficients of such a best fit model may be determined based on a spherical model of wafer bow.

One specific example of a best fit model that relates an estimated capacitance of a wafer to a platen surface (('w) to an estimated amount of wafer bow (d) is: d≈ Coeff1*$C_w^3$+Coeff2*$C_w^2$+Coeff3*$C_w$+Coeff4, where Coeff1, Coeff2, Coeff3, and Coeff4 denote coefficients that may be determined based on experimental data and/or based on a spherical model of wafer bow; and where d denotes an approximate distance of the wafer center or edge above the platen surface. Therefore, d denotes an estimated amount of wafer bow.

Another specific example of a best fit model that relates an estimated capacitance of a wafer to a platen surface ($C_w$) and a wafer rise (h) is: $C_w \approx$ Coeff1*$h^5$+Coeff2*$h^4$+Coeff3*$h^3$+Coeff4*$h^2$+Coeff5*h+Coeff6, where $Coeff_1$, $Coeff_2$, $Coeff_3$, $Coeff_4$, $Coeff_5$, and $Coeff_6$ denote coefficients that may be determined based on experimental data and/or based on a spherical model of wafer bow: In the specific example given above, h can denote a wafer rise that corresponds to an amount of wafer bow. For example, in an instance of convex bowing (generally referred to herein as "warping"), h can correspond to a distance of an edge of the wafer above a plane corresponding to a location of a flat wafer if such a flat wafer were positioned on the platen. Conversely, in an instance of concave bowing, h can correspond to a distance of a center of the wafer above the plane corresponding to a location of a flat wafer if such a flat wafer were positioned on the platen.

Figure 5:
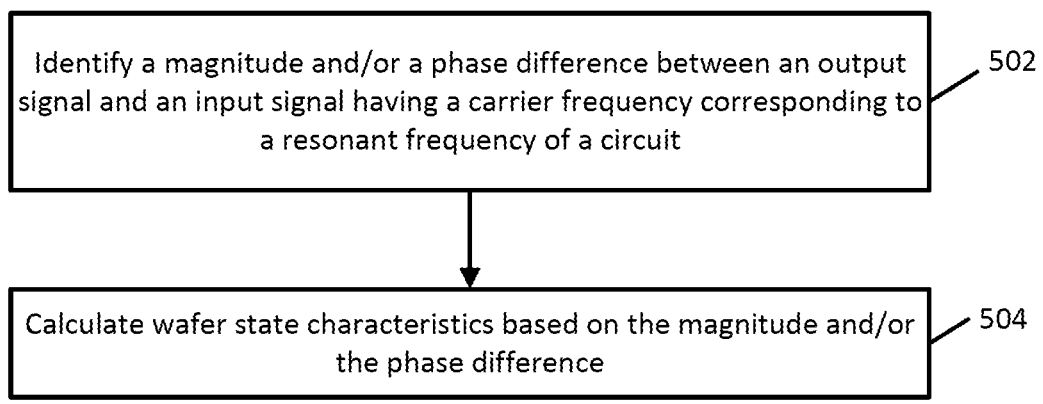
FIG. 5 presents another example of a process for calculating wafer state characteristics in accordance with some embodiments.

FIG. 5 shows an example of a process 500 for calculating wafer state characteristics based on differences in magnitude and/or phase of an output signal relative to an input signal in accordance with some embodiments. More particularly, process 500 shows an example of a process for estimating wafer bow without estimating an intermediate capacitance of the wafer to a platen surface (e.g., as in FIG. 4 above). In some embodiments, blocks of process 500 can be executed by a controller (e.g., a controller of detection circuit 138 of FIG. 1) associated with an ESC. In some embodiments, two or more blocks of process 500 may be executed substantially in parallel. It should be noted that, in some embodiments, blocks of process 500 may be performed in orders not shown in FIG. 5.

At 502, the controller can be configured to identify a magnitude and/or a phase difference between an output signal and an input signal, where the input signal has a carrier frequency corresponding to a resonant frequency of the circuit. In some embodiments, the resonant frequency of the circuit may correspond to a resonant frequency of the circuit with no wafer, with a bare silicon wafer, and/or a flat wafer (e.g., a wafer known to be properly clamped). For example, the resonant frequency of the circuit may be identified during a calibration procedure as shown in and described above in connection with FIG. 3.

In some embodiments, the input signal can be injected at an input side corresponding to a first electrode of a group of electrodes of the ESC. In some embodiments, the output signal can be measured at an output side corresponding to one or more electrodes of the group of electrodes other than the first electrode.

In some embodiments, the magnitude can be calculated as a ratio of an amplitude of the output signal to an amplitude of the input signal. In some embodiments, the phase difference can be calculated as a difference of a phase of the output signal relative to a phase of the input signal.

At 504, the controller can be configured to calculate wafer state characteristics based on the magnitude and/or the phase difference. For example, in some embodiments, the controller can calculate an estimated amount of wafer bow based on the estimated capacitance. As another example, in some embodiments, the controller can be configured to determine if the wafer is declamped based on a determination that an estimated amount of wafer bow exceeds a threshold.

In some embodiments, the wafer state characteristics can be calculated using a best fit model that relates the magnitude and/or phase differences to an estimated amount of wafer bow.

A specific example of a best fit model that relates a phase difference between an output signal and an input signal to estimated wafer bow is:

$$\text{Estimated bow} = e^{\left(\frac{\text{phase difference}}{PRC} - \frac{0.5 * FSR}{PRC}\right)}.$$

In this example, PRC is a phase resistance coefficient that can represent a linear approximation of a slope of phase values, and FSR is a full scale range of phase differences. In this example, PRC may be calculated based on a maximum possible phase difference. An example of an equation to calculate PRC is: PRC=Coeff*((float) Max_Phase_Delta), where Max_Phase_Delta indicates a maximum possible phase difference between an output signal and an input signal, and where Coeff is a scaling coefficient. Example values of Coeff may be 0.03, 0.04, 0.05, etc.

It should be noted that, in some embodiments, an amount of wafer bow may be estimated using a best fit model that relates a magnitude difference between the output signal and the input signal to estimated wafer bow. In some embodiments, the best fit model may be an $n^{th}$ order polynomial, an exponential function, or the like.

Figure 9A:
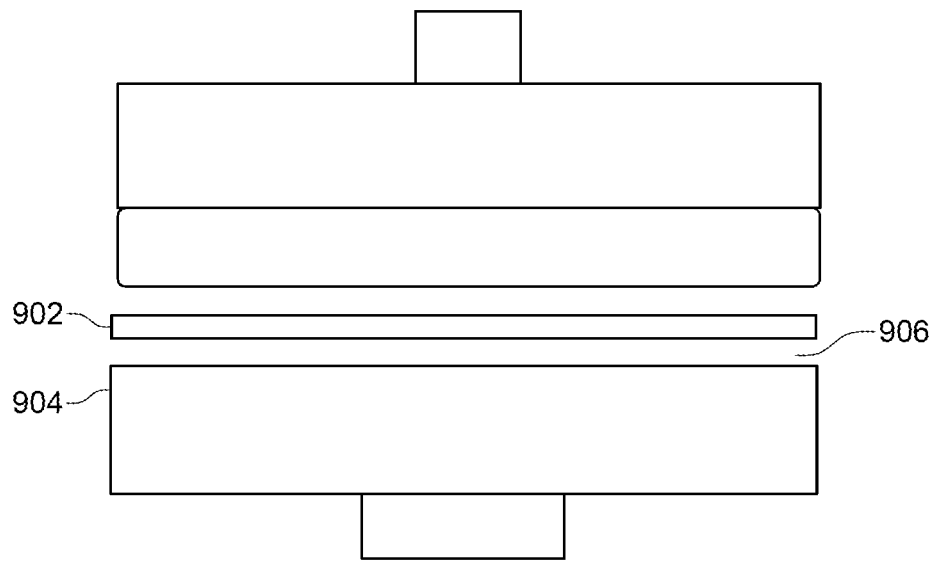
FIGS. 9A, 9B, and 9C show example schematic diagrams related to estimation of wafer bow based in accordance with some embodiments.
Figure 9B:
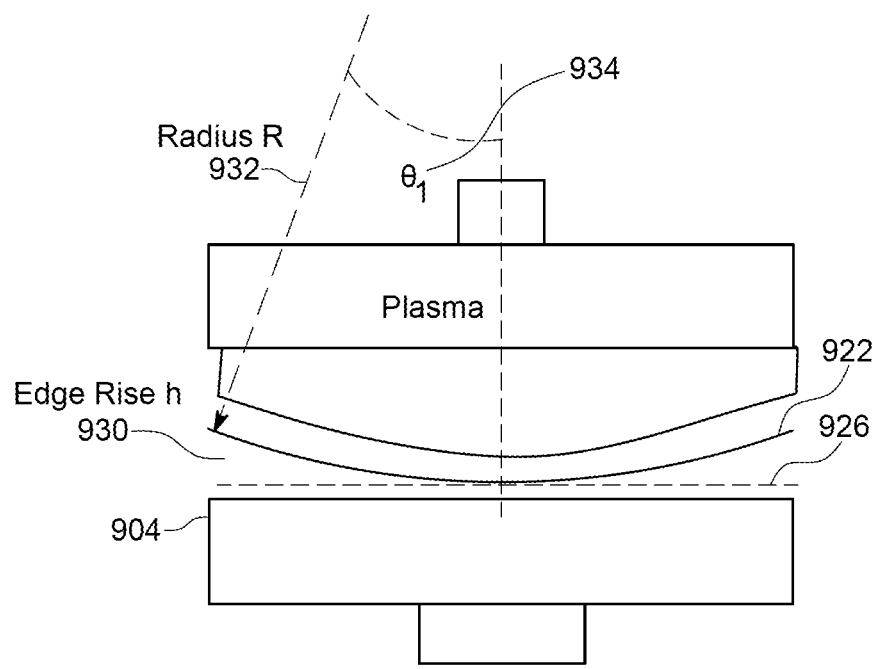
Figure 9C:
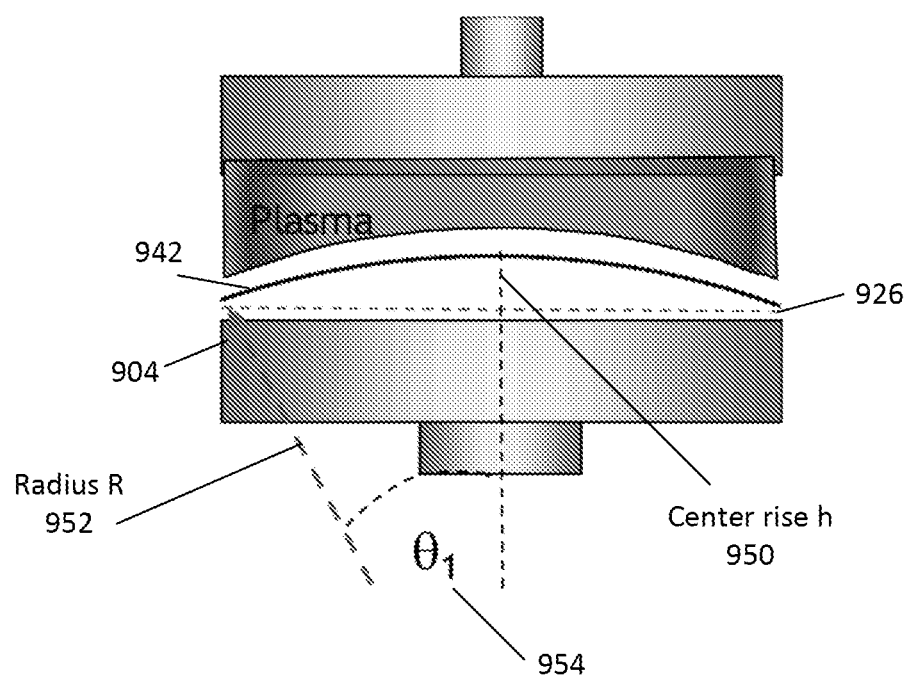

FIGS. 9A, 9B, and 9C illustrate schematic diagrams that can be used to relate an estimated capacitance between a wafer and a platen surface to an amount of wafer bow in accordance with some embodiments. More particularly, FIGS. 9A, 9B, and 9C illustrate relationships between the capacitance of a wafer to a platen surface and a gap between the wafer and the platen surface. In some embodiments, the relationship of the capacitance to the gap can be used to generate coefficients of a best fit model that relates the capacitance of the wafer to the platen surface and estimated wafer bow.

FIG. 9A illustrates a flat wafer 902 positioned on a platen surface 904. In the example of FIG. 9A, flat wafer 902 has an area A. In the example of FIG. 9A, there is a gap 906 (denoted as "d" herein) between flat wafer 902 and platen surface 904. In some embodiments, the capacitance of flat wafer 902 to platen surface 904 can be expressed as parallel plate capacitor expressions. For example, the capacitance $C_w$ can be expressed as:

$$C_w = \varepsilon_0 \frac{A}{d},$$

where A is the area of flat wafer 902, d corresponds to gap 906, and $\varepsilon_0$ is the dielectric constant.

FIG. 9B illustrates a convex wafer 922 positioned on platen surface 904. The convexity or degree of warping may be defined by an edge rise 930 (denoted as "h" in FIG. 9B) which indicates a distance of an edge of convex wafer 922 above a plane 926, where plane 926 corresponds to a position of a flat wafer if such a flat wafer were positioned on platen surface 904. That is, a gap between plane 926 and platen surface 904 is d, as in the example shown in and described above in connection with FIG. 9A. The warped or convex bowed wafer may be modeled as a portion of a sphere, that has a radius 932 (denoted herein as "R"). An angle 934 (denoted as $\theta_1$) indicates an angle between radius 932 and a midline of convex wafer 922. In some embodiments, the capacitance of convex wafer 922 to platen surface 904 can be expressed as a sum of capacitors in parallel.

FIG. 9C illustrates a concave wafer 942 positioned on platen surface 904. The degree of bowing may be defined by a center rise 950 (denoted as "h" in FIG. 9C) which indicates a distance of a center of concave wafer 942 above plane 926, where plane 926 corresponds to a position of a flat wafer if such a flat wafer were positioned on platen surface 904. That is, a gap between plane 926 and platen surface 904 is d, as in the example shown in and described above in connection with FIG. 9A. The concave wafer may be modeled as a portion of a sphere, that has a radius 952 (denoted herein as "R"). An angle 954 (denoted as $\theta_1$) indicates an angle between radius 952 and a midline of concave wafer 942. In some embodiments, the capacitance of concave wafer 942 to platen surface 904 can be expressed as a sum of capacitors in parallel.

Applications

The apparatuses, systems, methods, and/or media described herein may be used for detection of wafer bow or wafer declamping from a platen during processing. In particular, wafer bow may be detected and/or quantified based on differences between an output signal measured at an output of a circuit and an input signal injected at an input of the circuit. By operating at the resonant frequency of the circuit, wafer bow can be detected and/or quantified in connection with processing chambers and operations that utilize plasma and/or that operate at relatively high temperatures (e.g., above 400 degrees Celsius, above 500 degrees Celsius, above 600 degrees Celsius, etc.). In other words, wafer bow may be detected and/or quantified using characteristics that may be measured even at high temperatures and/or in instances in which plasma is utilized.

Context for Disclosed Computational Embodiments

Certain embodiments disclosed herein relate to computational systems for detecting wafer bow.

Many types of computing systems having any of various computer architectures may be employed as the disclosed systems for implementing algorithms as described herein. For example, the systems may include software components executing on one or more general purpose processors or specially designed processors such as Application Specific Integrated Circuits (ASICs) or programmable logic devices (e.g., Field Programmable Gate Arrays (FPGAs)). Further, the systems may be implemented on a single device or distributed across multiple devices. The functions of the computational elements may be merged into one another or further split into multiple sub-modules.

In some embodiments, code executed during generation or execution of a technique for detecting wafer bow on an appropriately programmed system can be embodied in the form of software elements which can be stored in a non-volatile storage medium (such as optical disk, flash storage device, mobile hard disk, etc.), including a number of instructions for making a computer device (such as personal computers, servers, network equipment, etc.).

At one level a software element is implemented as a set of commands prepared by the programmer/developer. However, the module software that can be executed by the computer hardware is executable code committed to memory using "machine codes" selected from the specific machine language instruction set, or "native instructions," designed into the hardware processor. The machine language instruction set, or native instruction set, is known to, and essentially built into, the hardware processor(s). This is the "language" by which the system and application software communicates with the hardware processors. Each native instruction is a discrete code that is recognized by the processing architecture and that can specify particular registers for arithmetic, addressing, or control functions; particular memory locations or offsets; and particular addressing modes used to interpret operands. More complex operations are built up by combining these simple native instructions, which are executed sequentially, or as otherwise directed by control flow instructions.

The inter-relationship between the executable software instructions and the hardware processor is structural. In other words, the instructions per se are a series of symbols or numeric values. They do not intrinsically convey any information. It is the processor, which by design was pre-configured to interpret the symbols/numeric values, which imparts meaning to the instructions.

The methods and techniques used herein may be configured to execute on a single machine at a single location, on multiple machines at a single location, or on multiple machines at multiple locations. When multiple machines are employed, the individual machines may be tailored for their particular tasks. For example, operations requiring large blocks of code and/or significant processing capacity may be implemented on large and/or stationary machines.

In addition, certain embodiments relate to tangible and/or non-transitory computer readable media or computer program products that include program instructions and/or data (including data structures) for performing various computer-implemented operations. Examples of computer-readable media include, but are not limited to, semiconductor memory devices, phase-change devices, magnetic media such as disk drives, magnetic tape, optical media such as CDs, magneto-optical media, and hardware devices that are specially configured to store and perform program instructions, such as read-only memory devices (ROM) and random access memory (RAM). The computer readable media may be directly controlled by an end user or the media may be indirectly controlled by the end user. Examples of directly controlled media include the media located at a user facility and/or media that are not shared with other entities. Examples of indirectly controlled media include media that is indirectly accessible to the user via an external network and/or via a service providing shared resources such as the "cloud." Examples of program instructions include both machine code, such as produced by a compiler, and files containing higher level code that may be executed by the computer using an interpreter.

In various embodiments, the data or information employed in the disclosed methods and apparatus is provided in an electronic format. Such data or information may include various coefficients to be used in calculations, and the like. As used herein, data or other information provided in electronic format is available for storage on a machine and transmission between machines. Conventionally, data in electronic format is provided digitally and may be stored as bits and/or bytes in various data structures, lists, databases, etc. The data may be embodied electronically, optically, etc.

System software typically interfaces with computer hardware and associated memory. In some embodiments, the system software includes operating system software and/or firmware, as well as any middleware and drivers installed in the system. The system software provides basic non-task-specific functions of the computer. In contrast, the modules and other application software are used to accomplish specific tasks. Each native instruction for a module is stored in a memory device and is represented by a numeric value.

Figure 10:
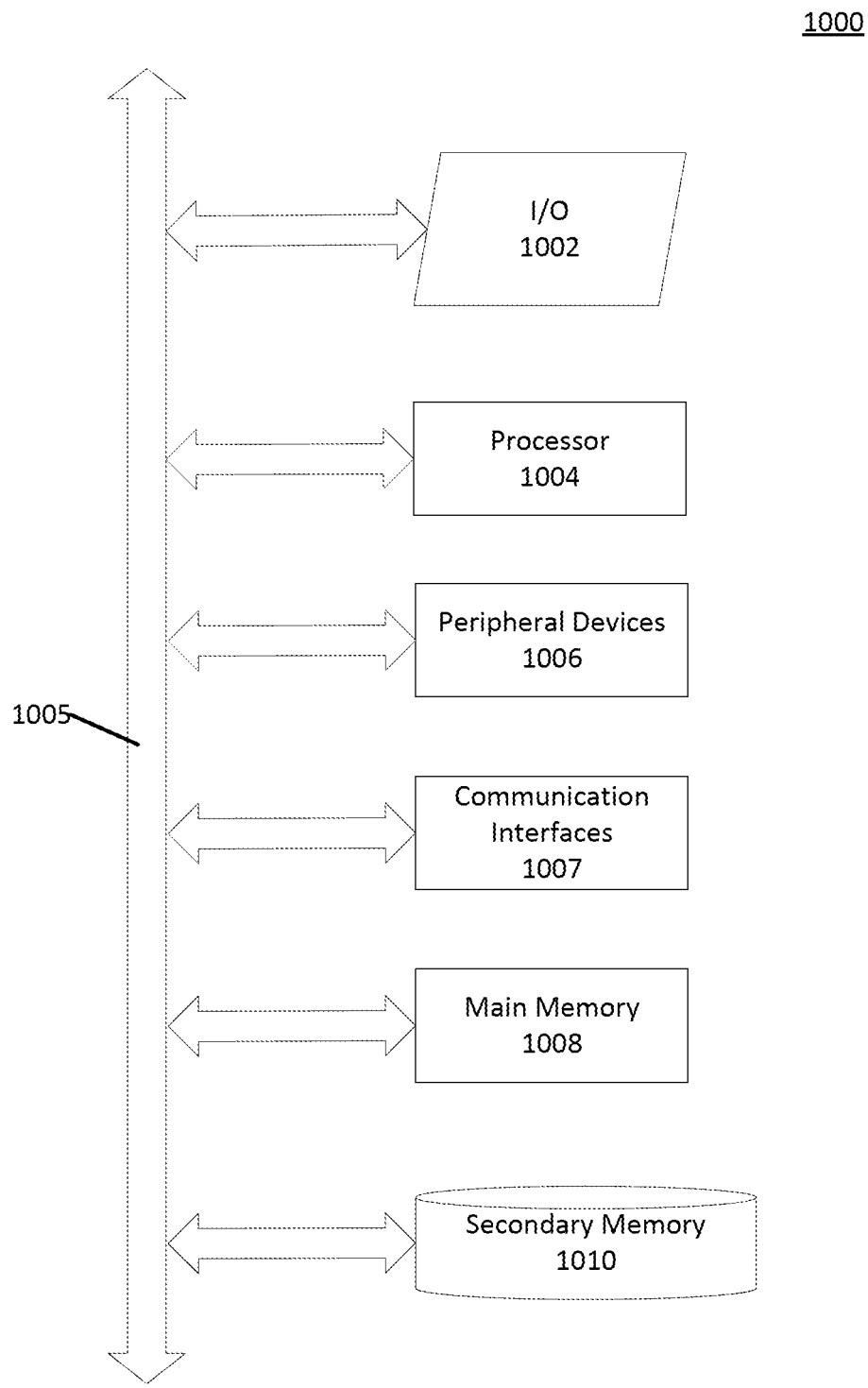
FIG. 10 presents an example computer system that may be employed to implement certain embodiments described herein.

An example computer system 1000 is depicted in FIG. 10. As shown, computer system 1000 includes an input/output subsystem 1002, which may implement an interface for interacting with human users and/or other computer systems depending upon the application. Embodiments of the disclosure may be implemented in program code on system 1000 with I/O subsystem 1002 used to receive input program statements and/or data from a human user (e.g., via a GUI or keyboard) and to display them back to the user. The I/O subsystem 1002 may include, e.g., a keyboard, mouse, graphical user interface, touchscreen, or other interfaces for input, and, e.g., an LED or other flat screen display, or other interfaces for output.

Communication interfaces 1007 can include any suitable components or circuitry used for communication using any suitable communication network (e.g., the Internet, an intranet, a wide-area network (WAN), a local-area network (LAN), a wireless network, a virtual private network (VPN), and/or any other suitable type of communication network). For example, communication interfaces 1007 can include network interface card circuitry, wireless communication circuitry, etc.

Program code may be stored in non-transitory media such as secondary memory 1010 or memory 1008 or both. In some embodiments, secondary memory 1010 can be persistent storage. One or more processors 1004 reads program code from one or more non-transitory media and executes the code to enable the computer system to accomplish the methods performed by the embodiments herein, such as those involved with detecting wafer bow as described herein. Those skilled in the art will understand that the processor may accept source code, such as statements for executing training and/or modelling operations, and interpret or compile the source code into machine code that is understandable at the hardware gate level of the processor. A bus 1005 couples the I/O subsystem 1002, the processor 1004, peripheral devices 1006, communication interfaces 1007, memory 1008, and secondary memory 1010.

CONCLUSION

In the description, numerous specific details were set forth in order to provide a thorough understanding of the presented embodiments. The disclosed embodiments may be practiced without some or all of these specific details. In other instances, well-known process operations were not described in detail to not unnecessarily obscure the disclosed embodiments. While the disclosed embodiments were described in conjunction with the specific embodiments, it will be understood that the specific embodiments are not intended to limit the disclosed embodiments.

Unless otherwise indicated, the method operations and device features disclosed herein involves techniques and apparatus commonly used in metrology, semiconductor device fabrication technology, software design and programming, and statistics, which are within the skill of the art.

Unless defined otherwise herein, all technical and scientific terms used herein have the same meaning as commonly understood by one of ordinary skill in the art. Various scientific dictionaries that include the terms included herein are well known and available to those in the art. Although any methods and materials similar or equivalent to those described herein find use in the practice or testing of the embodiments disclosed herein, some methods and materials are described.

Numeric ranges are inclusive of the numbers defining the range. It is intended that every maximum numerical limitation given throughout this specification includes every lower numerical limitation, as if such lower numerical limitations were expressly written herein. Every minimum numerical limitation given throughout this specification will include every higher numerical limitation, as if such higher numerical limitations were expressly written herein. Every numerical range given throughout this specification will include every narrower numerical range that falls within such broader numerical range, as if such narrower numerical ranges were all expressly written herein.

The headings provided herein are not intended to limit the disclosure.

As used herein, the singular terms "a," "an," and "the" include the plural reference unless the context clearly indicates otherwise. The term "or" as used herein, refers to a non-exclusive or, unless otherwise indicated.

Various computational elements including processors, memory, instructions, routines, models, or other components may be described or claimed as "configured to" perform a task or tasks. In such contexts, the phrase "configured to" is used to connote structure by indicating that the component includes structure (e.g., stored instructions, circuitry, etc.) that performs the task or tasks during operation. As such, the unit/circuit/component can be said to be configured to perform the task even when the specified component is not necessarily currently operational (e.g., is not on).

The components used with the "configured to" language may refer to hardware—for example, circuits, memory storing program instructions executable to implement the operation, etc. Additionally, "configured to" can refer to generic structure (e.g., generic circuitry) that is manipulated by software and/or firmware (e.g., an FPGA or a general-purpose processor executing software) to operate in manner that is capable of performing the recited task(s). Additionally, "configured to" can refer to one or more memories or memory elements storing computer executable instructions for performing the recited task(s). Such memory elements may include memory on a computer chip having processing logic. In some contexts, "configured to" may also include adapting a manufacturing process (e.g., a semiconductor fabrication facility) to fabricate devices (e.g., integrated circuits) that are adapted to implement or perform one or more tasks

What is claimed is:

1. An apparatus for wafer state detection, comprising:
   an RF blocking filter;
   a DC blocking filter; and
   a controller coupled to a plurality of electrodes associated with an electrostatic chuck (ESC) via the RF blocking filter and the DC blocking filter, wherein the controller is configured to:
   cause an input signal to be injected in an input side of a circuit associated with the plurality of electrodes, the RF blocking filter, and the DC blocking filter, wherein the input side corresponds to a first electrode of the plurality of electrodes;
   measure characteristics of an output signal at an output side of the circuit, wherein the output side corresponds to a second electrode of the plurality of electrodes; and
   calculate wafer state characteristics of a wafer positioned on a surface of a platen of the ESC based on the characteristics of the output signal.

2. The apparatus of claim 1, wherein the RF blocking filter, the DC blocking filter, and the controller are included in a single housing.

3. The apparatus of claim 2, wherein the single housing is associated with a power supply of the ESC.

4. The apparatus of claim 1, wherein the RF blocking filter comprises one or more inductors.

5. The apparatus of claim 4, wherein the one or more inductors are ferrite core inductors.

6. The apparatus of claim 1, wherein the DC blocking filter comprises a capacitor.

7. The apparatus of claim 6, wherein the capacitor is of a same order of magnitude of a plurality of capacitors that each couple RF inputs to the plurality of electrodes.

8. The apparatus of claim 1, wherein the input signal has a carrier frequency corresponding to a resonant frequency of the circuit associated with the plurality of electrodes, the RF blocking filter, and the DC blocking filter, wherein the resonant frequency is determined during a calibration process of the circuit.

9. The apparatus of claim 8, wherein the calibration process comprises determining the resonant frequency of the circuit with no wafer positioned on the surface of the platen or with a flat wafer positioned on the surface of the platen.

10. The apparatus of claim 8, wherein the characteristics of the output signal comprise a phase of the output signal.

11. The apparatus of claim 10, wherein calculating the wafer state characteristics comprises estimating an amount of wafer bow based on a difference of the phase of the output signal relative to the input signal.

12. The apparatus of claim 11, wherein the controller is further configured to estimate the amount of wafer bow based on the difference of the phase of the output signal relative to the input signal using one or more best fit coefficients.

13. The apparatus of claim 1, wherein the controller is further configured to:
identify a resonant frequency of a circuit associated with the plurality of electrodes, the RF blocking filter, the DC blocking filter, and the wafer positioned on the surface of the platen;
estimate a capacitance of the wafer to the surface of the platen based on the resonant frequency of the circuit; and
estimate an amount of wafer bow based on the estimated capacitance of the wafer to the surface of the platen.

14. The apparatus of claim 1, wherein the controller is further configured to generate an alert that indicates the wafer state characteristics.

15. The apparatus of claim 14, wherein the alert indicates that the wafer is declamped from the surface of the platen.

16. The apparatus of claim 14, wherein the alert indicates an amount of estimated wafer bow.

17. The apparatus of claim 1, wherein the plurality of electrodes comprises three or more electrodes, and wherein the controller is further configured to:
cause a second input signal to be injected in a second input side of the circuit, wherein the second input side corresponds to the second electrode of the plurality of electrodes; and
measure characteristics of a second output signal at a second output side of the circuit, wherein the second output side corresponds to a third of the plurality of electrodes.

18. The apparatus of claim 1, wherein the plurality of electrodes comprises three or more electrodes, and wherein the controller is further configured to measure two or more output signals at two or more output sides of the circuit, and wherein the two or more output sides correspond to electrodes of the plurality of electrodes other than the first electrode of the plurality of electrodes.

19. A method for wafer state detection, comprising:
causing an input signal to be injected in an input side of a circuit associated with a plurality of electrodes of an ESC, an RF blocking filter associated with the ESC, and a DC blocking filter associated with the ESC, wherein the input side corresponds to a first electrode of the plurality of electrodes;
measuring characteristics of an output signal at an output side of the circuit, wherein the output side corresponds to a second electrode of the plurality of electrodes; and
calculating wafer state characteristics of a wafer positioned on a surface of a platen of the ESC based on the characteristics of the output signal.

20. The method of claim 19, wherein the input signal has a carrier frequency corresponding to a resonant frequency of the circuit, wherein the resonant frequency is determined during a calibration process of the circuit.

21. The method of claim 20, wherein the resonant frequency is identified based on an operating temperature of the ESC.

22. The method of claim 20, further comprising calculating a difference between a phase of the output signal and a phase of the input signal, wherein the wafer state characteristics are calculated based on the difference.

23. The method of claim 22, wherein calculating the wafer state characteristics comprises calculating an amount of wafer bow of the wafer using a best fit model that relates the difference between the phase of the output signal and the phase of the input signal to the amount of wafer bow.

24. The method of claim 23, wherein the best fit model is an exponential function.

25. The method of claim 19, wherein calculating the wafer state characteristics comprises:
identifying a resonant frequency of the circuit associated with the plurality of electrodes, the RF blocking filter, and the DC blocking filter with the wafer positioned on the surface of the platen;
calculating an estimated capacitance of the wafer to the surface of the platen using a first best fit model that relates the resonant frequency of the circuit to the estimated capacitance of the wafer to the surface of the platen; and
calculating an amount of wafer bow of the wafer using a second best fit model that relates the estimated capacitance of the wafer to the surface of the platen to the amount of wafer bow.

26. The method of claim 25, wherein coefficients of the second best fit model are based on a spherical model of wafer bow.

27. The method of claim 25, wherein the second best fit model is a polynomial function.

* * * * *